US006182351B1

United States Patent
Li et al.

(10) Patent No.: US 6,182,351 B1
(45) Date of Patent: *Feb. 6, 2001

(54) METHOD OF PRODUCING SUPERCONDUCTING TAPES WITH A HIGH CURRENT DENSITY

(75) Inventors: Qi Li, Westborough, MA (US); Kristian Brok, Copenhagen (DK); Torsten Freltoft, Ringsted (DK); Leif Dalum, Hørsholm (DK)

(73) Assignee: NKT Research Center A/S, Brondby (DK)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/637,726
(22) PCT Filed: Nov. 11, 1994
(86) PCT No.: PCT/DK94/00427
   § 371 Date: May 2, 1996
   § 102(e) Date: May 2, 1996
(87) PCT Pub. No.: WO95/13627
   PCT Pub. Date: May 18, 1995

(30) Foreign Application Priority Data

Nov. 12, 1993 (DK) .................................................. 1282/93

(51) Int. Cl.$^7$ .................................................. H01L 39/24
(52) U.S. Cl. ............................................ 29/599; 505/433
(58) Field of Search ............................ 72/240, 189, 190, 72/406; 505/433, 928; 29/599

(56) References Cited

U.S. PATENT DOCUMENTS 3,102,443  *  9/1963  Dell et al. .............................. 72/189

3,575,029  *  4/1971  Weber .................................. 72/240

(List continued on next page.)

FOREIGN PATENT DOCUMENTS

| 0 475 466 | 3/1992 | (EP) . | |
|---|---|---|---|
| 880523 | * 11/1981 | (RU) | ..................................... 72/240 |
| 1194520 | * 11/1985 | (RU) | ..................................... 72/240 |
| WO 93/14526 | 7/1993 | (WO) . | |

OTHER PUBLICATIONS

Patent Abstract of Japan, 2–183918(A), vol. 14, No. 457 (E986).
Patent Abstract of Japan, 2–192619(A), vol. 14, No. 471 (E990).

(List continued on next page.)

Primary Examiner—S. Thomas Hughes
(74) Attorney, Agent, or Firm—Pillsbury Madison & Sutro LLP

(57) ABSTRACT

The inventive method for producing a superconductor is accomplished by longitudinally pulling a metal pipe having a cavity filled with a metal oxide mixture in polycrystalline powder to reduce the outer diameter of the pipe, sintering the metal oxide mixture to form a workpiece, and progressively flattening the workpiece in a succession of pressings. The flattening step is conducted with a pair of coordinately operated clamping jaws, each of which having a work surface which is curvilinear with distinct opposite ends. The clamping jaws are mounted to hinged brackets connected by eccentric arms to rotatable shafts arranged for providing power transmission to the clamping jaws such that, during each of the pressings, each eccentric arm extends at an angle to a respective hinged bracket which is approximately 0° or approximately 180° when power transmission to the workpiece is maximal. The clamping jaws are moved along paths to cause flattening to occur substantially entirely by widening the workpiece without substantially lengthening the workpiece. The work piece is then advanced about 4 mm between pressings as the clamping jaws are returned to their clamping positions, and the pressing is repeated.

4 Claims, 7 Drawing Sheets

U.S. PATENT DOCUMENTS

| | | | | |
|---|---|---|---|---|
| 3,577,760 | * | 5/1971 | Franke | 72/240 X |
| 3,583,192 | * | 6/1971 | Kocks | 72/189 |
| 3,590,621 | * | 7/1971 | Saxl | 72/240 X |
| 5,360,784 | | 11/1994 | Kimura et al. | 505/433 |

OTHER PUBLICATIONS

Hansen, Michael R., CADME Computer Aided Design of Mechanisms, Institute of Mechanical Engineering, Aalborg University, Ver. 1.0 Users Manual, Special Rapport Nr. 12, Apr. 1992.

* cited by examiner

METHOD OF PRODUCING SUPERCONDUCTING TAPES WITH A HIGH CURRENT DENSITY

This application claims benefit of international application PCT/DK94/00427 filed Nov. 11, 1994.

BACKGROUND OF THE INVENTION

1. Field of the Invention

The invention relates to a method of producing superconductors, especially in form of tapes with a relatively high critical current density, by a mechanical deformation provided by means of a tool mechanism comprising movable clamping jaws and hinged brackets and eccentric arms connected to the clamping jaws, which are formed in such a way that the final product has a uniform thickness.

2. Background Art

It is known that high-temperature superconducting tapes can be produced by filling a mixture of metaloxide powders into a metal pipe, whereafter the pipe is deformed by being pulled into a round wire, followed by being extruded, rolled or pressed into a flat tape. Then the tape is heat-treated in such a manner that the powder is sintered to form a coherent, superconducting mass. These mechanical and thermal processes can be repeated in order to improve the superconducting properties, including the critical current density.

Metaloxide powders which can be used are, for instance, $YBa_2Cu_3O_7$, $Bi_{2-x}Pb_xSr_2Ca_2Cu_3O_y$, $Tl_2Ba_2Ca_2Cu_3O_y$ in polycrystalline form, in which the crystals are slightly plastic and very brittle. The metal coatings can be made of Ag or Ag-alloys which unlike the above mentioned powders, are very plastic and brittle. It is difficult to control a mechanical deformation of composite articles made of such materials, because the materials possess differing material liquidities. A ceramic, superconducting article must, however, possess predetermined structural properties in order to obtain a high critical current density. As few microcracks as possible must be present together with a high degree of texture with the superconducting Cu—O planes parallel to the current direction, and a high degree of uniformity with respect to the density, as well as a good electric interaction between the superconducting grains. It is important for obtaining these features that it be possible to control and optimize the forces having an effect on the article during the mechanical deformation.

It has been demonstrated on small lengths of tape, e.g. ones which are about 2 to 8 cm, in length that the critical current density can be improved by 3 to 4 times, provided the article after the first rolling and heat-treatment is subjected to one or more cycles involving a uniaxial force applied perpendicular to the current direction and followed by a sintering. It is, however, difficult to operate such a procedure as a continuous process, which is presumably necessary for allowing use of the articles for the production of tape-shaped wires.

During rolling of a wire into a tape, the deforming forces can be divided into a pressing force and a displacing force. During rolling, these two-forces are non-homogeneously distributed in the tape with the result that the superconducting ceramics are non-homogeneously compressed. In addition, the displacing force causes microcracks transverse to the current direction in the plane of the tape, either during the rolling or during the following sintering where possible residual tensions are released. The deformation caused by the rolling results in a higher material liquidity in the longitudinal direction than in the transverse direction of the tape. Ceramic crystals already developed can thereby be broken during succeeding rollings with the unfortunate result that microcracks may arise in the transverse direction.

Uniaxial pressing provides a very uniform power effect without noticeable displacing forces in the longitudinal direction of the wire. Such a pressing causes the material to be liquidized substantially only in the transverse direction. In addition, such a deformation reduces the formation of microcracks transverse to the current direction. Uniaxial pressing can, however, not be performed continuously.

SUMMARY OF THE INVENTION

The object of the invention is to provide a method of continuously deforming an article, but substantially without deformation in the longitudinal direction.

A method of the above type is according to the invention characterized in that the mechanical deformation is performed continuously, or stepwise continuously, and that the clamping jaws and the hinged brackets and eccentric arms connected thereto are formed such that during the deformation the same relative coordinate applies in the longitudinal direction, whereby the deformation in the longitudinal direction is negligible.

The resulting deformation method highly resembles uniaxial pressing.

A tool mechanism ensuring the above described type of deformation can be a continuously driven multi-member mechanism, but which only subjects the article to processing during a limited period of the process. The mechanism moves the clamping jaws in such a manner that only some of these clamping jaws are in contact with the article until a predetermined time and such that the pressing of the article is progressive, i.e. the processed length of the article is gradually increased. The quasi uniaxial pressing is obtained by the clamping jaws clamping on a portion of the article which has already been completely pressed while a portion not being completely pressed is subjected to the pressing. The resulting yielding of the article in its longitudinal direction is thereby minimized.

Furthermore according to the invention, the clamping jaws and the hinged brackets and eccentric arms connected thereto may be formed such that the power transmission to the clamping jaws is optimized by the angle between an eccentric arm and a hinged bracket connected thereto is close to 0° or 180° when the power transmission is maximal. Each arm is synchronously subjected to an input moment and an angular speed. In order to make the transmission of the torque as efficient as possible, the mechanism is formed in such a way that the angle of transmission of the torque is good on at least one of the arms as long as the article, e.g. the wire, is subjected to a processing by the clamping jaws. The transmission of power can be further improved by the mechanism transmitting the power from the processing into the frame in directions where the frame can be reinforced.

In addition, according to the invention, the tool mechanism may be formed in such a way that the maximum rigidity is obtained, which is obtained by the elements between the clamping jaws and the frame being made as short as possible. The elements must, however, be able to provide the desired curve.

Furthermore, according to the invention, the clamping jaws and the hinged brackets and eccentric arms connected thereto may be formed such that the largest possible length is processed per time unit. In practice, a tool mechanism is chosen which provides a moving curve for the clamping jaws presenting the longest approximately linear segment when measured in the angular turning on the input side.

BRIEF DESCRIPTION OF THE DRAWINGS

The invention is explained in greater detail below with reference to the accompanying drawings, in which.

DETAILED DESCRIPTION OF A PREFERRED EMBODIMENT OF THE INVENTION

Figure 1:
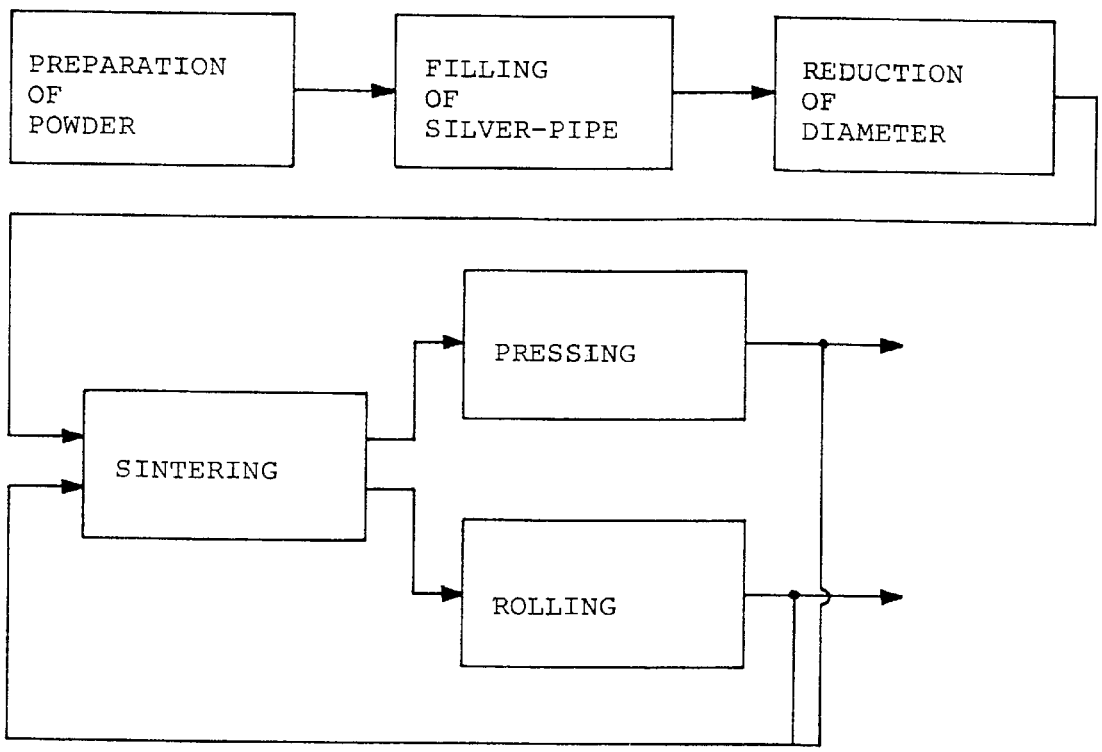
FIG. 1 illustrates a method of producing a tape-shaped article in form of a superconducting tape.
Figure 2:
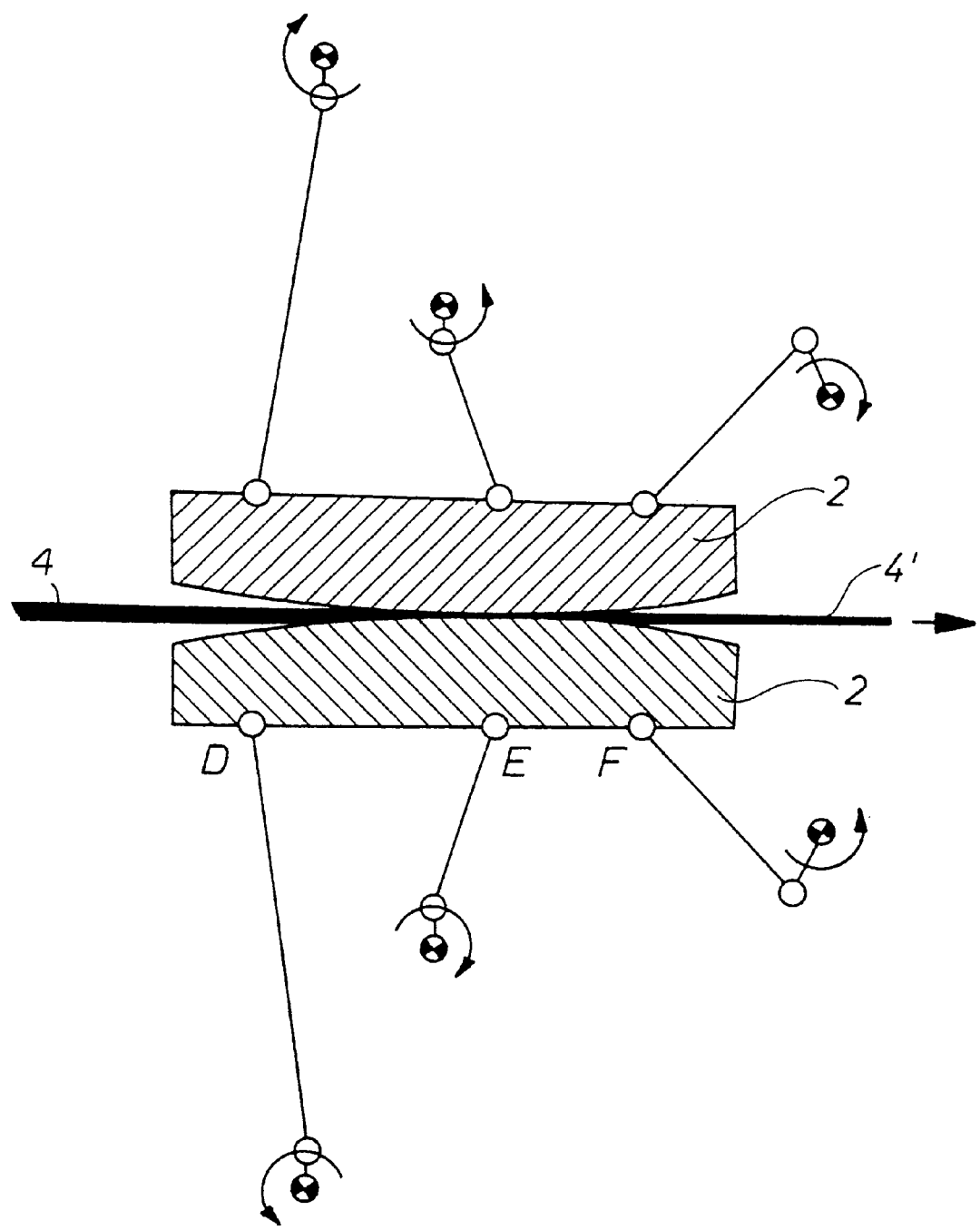
FIG. 2 illustrates a tool machine for continuously deforming tape-shaped articles and comprising two hinged bracket moving mechanisms.

Below, a tool machine for the production of tape-shaped articles, such as superconducting tapes is described. A mechanical technology is dealt with where a wire composed of various materials is provided. The wire is subsequently subjected to mechanical deformation which can be compared with uniaxial pressing. The entire production process appears from FIG. 1.

A powder of ceramic superconducting material is filled into a pipe made of silver. The pipe is subjected to pulling in order to reduce its outer diameter and then is subjected to sintering at approximately 830° C. The sintering is followed by pressing or rolling to form tapes.

The production of superconducting tapes involves a number of factors implying that predetermined requirements must be presented to the mechanical processing and consequently to the tool machine. The most important requirements are based on the demand for:

a desired texture, a uniform distribution of the power, a continuous production process, and a major supply of energy during the process.

The first two above-stated requirements relate to the superconducting properties of the tape, whereas the last two above-stated requirements relate to the necessary time and consequently to the production costs.

The final superconducting tapes must have a texture which is not prone to cracking in a direction perpendicular to the longitudinal direction of the tape. Accordingly, it is important that during the production the tape is not subjected to forces causing displacing tensions in the longitudinal direction of the tape.

During the production of long tapes from a wire it is therefore important that all cross-sections of the wire be subjected to the same force, and that this force be the same in all cross-sections of the wire.

The production process must be continuous, or stepwise continuous, in order to allow production of long tapes and a reliable process with controllable parameters. Finally, a continuous production process results in a short production period.

In order to reduce the production period, and indeed in order to avoid a strong compression of the superconducting powder, it is important that relatively high amounts of energy can be supplied during the production process.

Previously, the production of superconducting articles based on ceramic powder involved two processing procedures, namely a pressing and a rolling.

The production of tapes of pressing renders it possible to obtain uniform forces on all the cross-sections of the wire. Furthermore, the forces act perpendicular to the longitudinal direction of the wire which improves the orientation in the powder. The pressing is, however, encumbered with the drawback that the article is processed in one step, which means that the mechanical processing must be performed in one step. Such a procedure presents increased requirements to the tool machine and limits the applicability of the process. In addition, pressing is a discontinuous process.

Conventional rollers were previously used for the production of superconducting tapes. During rolling, the wires were subjected to a mechanical effect involving both a displacing tension and a pressing tension. The rolling results in a texture, i.e. material properties depending on the direction, where, in particular, the lattice orientation in the ceramic material is of major importance.

The displacing tension causes the movement through the rollers. Attempts have been made at minimizing the displacing tension by means of various pulling rollers, whereby the rolling can be performed without noticeable displacing tensions. The article is, however, subjected to some displacing tensions by the pulling rollers, and the resulting texture has not been improved.

The rolling process is continuous and can be used for the production of tapes of an arbitrary length. The rollers can be formed so as to supply relatively high amounts of energy to the wire. However, the displacing tension in the wire is correspondingly increased. Rollers are available for the production of thin articles and for the production of articles by means of a strong power effect. By the production of superconducting tapes by means of rollers, the radii of these rollers must be as large as possible in order to reduce the displacing forces. Large roller diameters limit, however, the rigidity and consequently the possibilities of producing thin wires or tapes.

Attempts have been made by a method according to the invention at combining the advantages of rolling and pressing by means of particularly shaped tool parts in form of clamping jaws 2 simultaneously with avoiding some of the drawbacks. The clamping jaws 2 each have a curvilinear surface with distinct opposite ends along the path of movement. The moving pattern of the clamping jaws 2 allows a semicontinuous production process, the production of long lengths, the uniform distribution of the forces, the uniform distribution of the energy, and the high supply of power and energy.

The wire-forming process is semicontinuous because only a limited portion of the wire is subjected to a processing at a time, while in principle it is possible to produce extremely long tapes.

A suitable choice of moving pattern and curve shape of the clamping jaws being in contact with the wire or the tape during the producing process renders it possible to achieve a uniform distribution of the forces in all the cross-sections of the article. In addition, as all the cross-sections of the article are processed in several steps, it is possible to obtain a uniform supply of energy over the entire length of the article.

The processing of the wire can be compared with a rolling process by means of a roller of a very large diameter. When corresponding roller diameters are employed by a conventional rolling process it is, however, only possible to produce articles of relatively large thicknesses due to the fact that the resilient bending outwards of the rolling material exceeds the deformation necessary for achieving the yielding.

The gripping of the wire by the tool parts is performed in the same manner as during a rolling process, with the result that no wire cross-sections are subjected to stronger displacing tensions than the neighbouring cross-sections. Although the clamping jaws 2 are not in constant contact with the wire, the drawbacks of the pressing have nevertheless been avoided.

A semicontinuous production of wire is thus provided, allowing a high uniform supply of energy for long wires or the like.

In order to obtain a mechanically rigid structure, the machine is designed with the shortest possible distance between the frame and the wire. A distance has been obtained which is less than 1/50 in connection with rollers of a corresponding roller diameter.

The supply of energy from the driving unit to the clamping jaws 2 must be such that the angles of transmission are advantageous in the period in which the tool parts subject the wire to a processing. Accordingly, a moving mechanism has been chosen which allow supplies of energy through several rotating driving shafts. In this manner, it is possible to use toggle-joint-like members in the moving mechanism and thereby to obtain advantageous angles of transmission at the same time as strong forces can be transmitted.

The moving mechanism comprises nine members and presents three degrees of freedom. Accordingly, the mechanism must comprise three synchronous driving shafts A, B and C for the supply of energy in order to be determined. The tool machine comprises two separate moving mechanisms with clamping jaws 2 operating against each other, but which are supplied with energy from the same driving unit and thereby moved synchronously. Once the moving pattern has been calculated, the final curve shape for the clamping jaws has been determined.

The simulation of the moving mechanism involves calculations which can only be performed by means of a computer. Several programs exist for this purpose, such as for instance CADME. The fundamental structure of the mechanism in the program is initially defined by means of this program by combining standard mechanisms from a library encoded in the program. Subsequently, the positions of the driving shafts, the frame, etc. are defined. CADME can both analyze and synthesize the mechanisms. Here it is only used for analyzing. An analysis can either be in form of a simulation on a screen or in form of a transfer of data to a file. The use of the program involves:

1) a kinematic simulation of various quantitative mechanisms so as to determine a combination of parameters providing optimum properties in the following areas:
   a) track curves for points of interest on the surface of the clamping jaw,
   b) distribution of forces and moments,
   c) consideration of the structure desired in relation to the pinions and moving mechanisms from a structural point of view,
2) calculation of coordinates during the running of the program for points of interest defined by the user. These coordinates are encoded in a text file and used for determining the curve shape of each clamping jaw.

Figure 3:
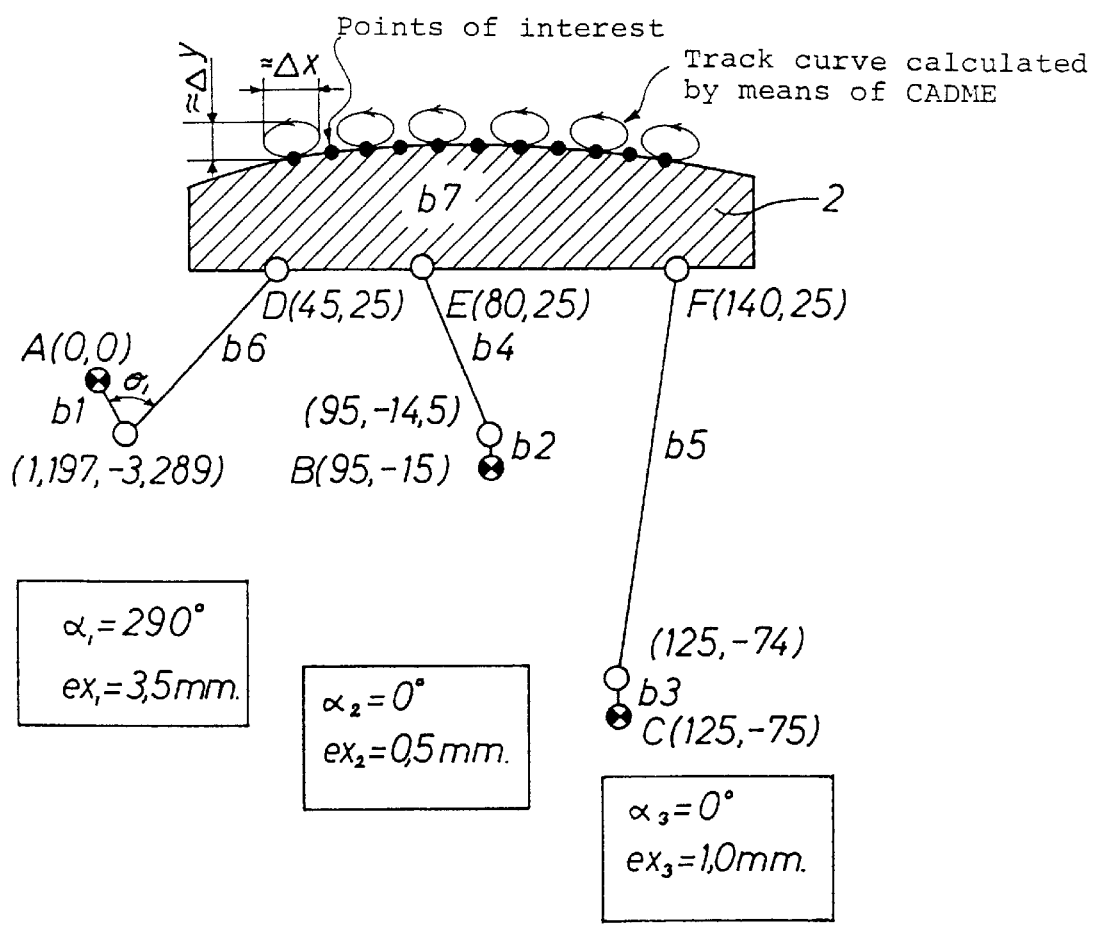
FIG. 3 illustrates a hinged bracket moving mechanism for a tool part of the tool machine.
Figure 4:
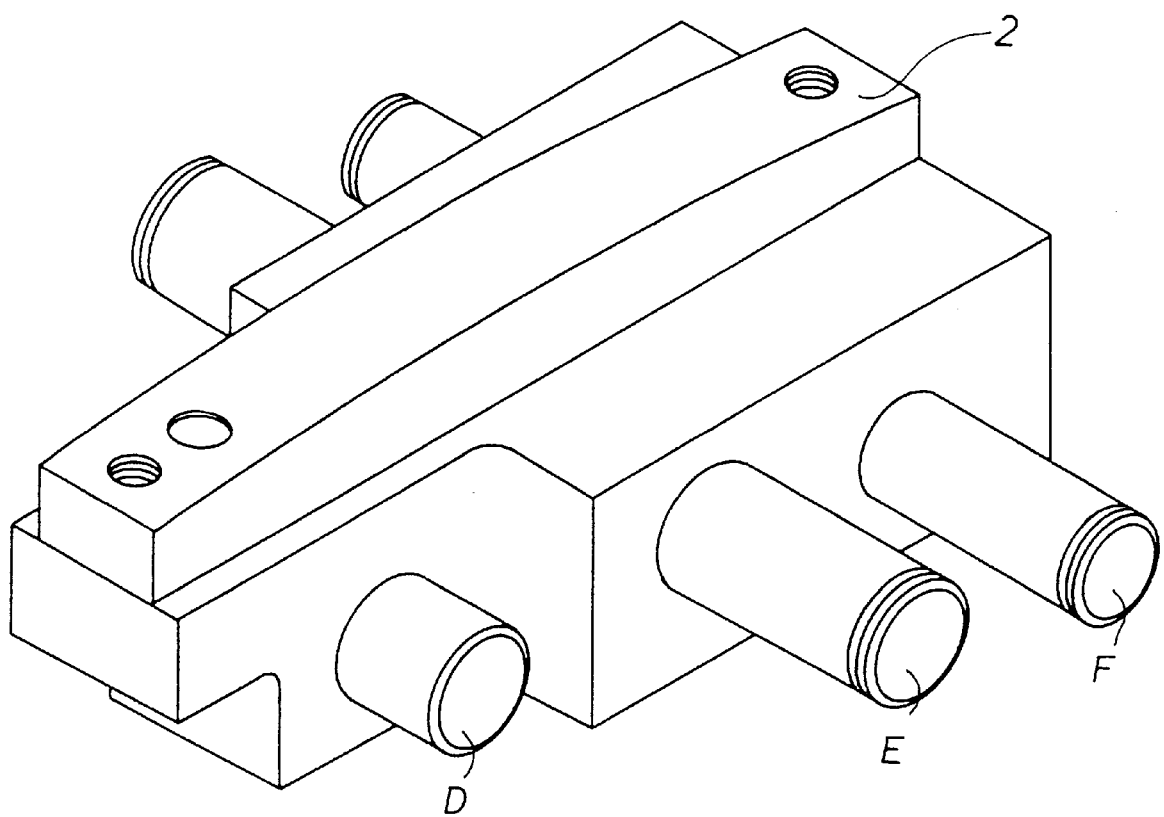
FIG. 4 is a perspective view of the tool part of FIG. 3.
Figure 5:
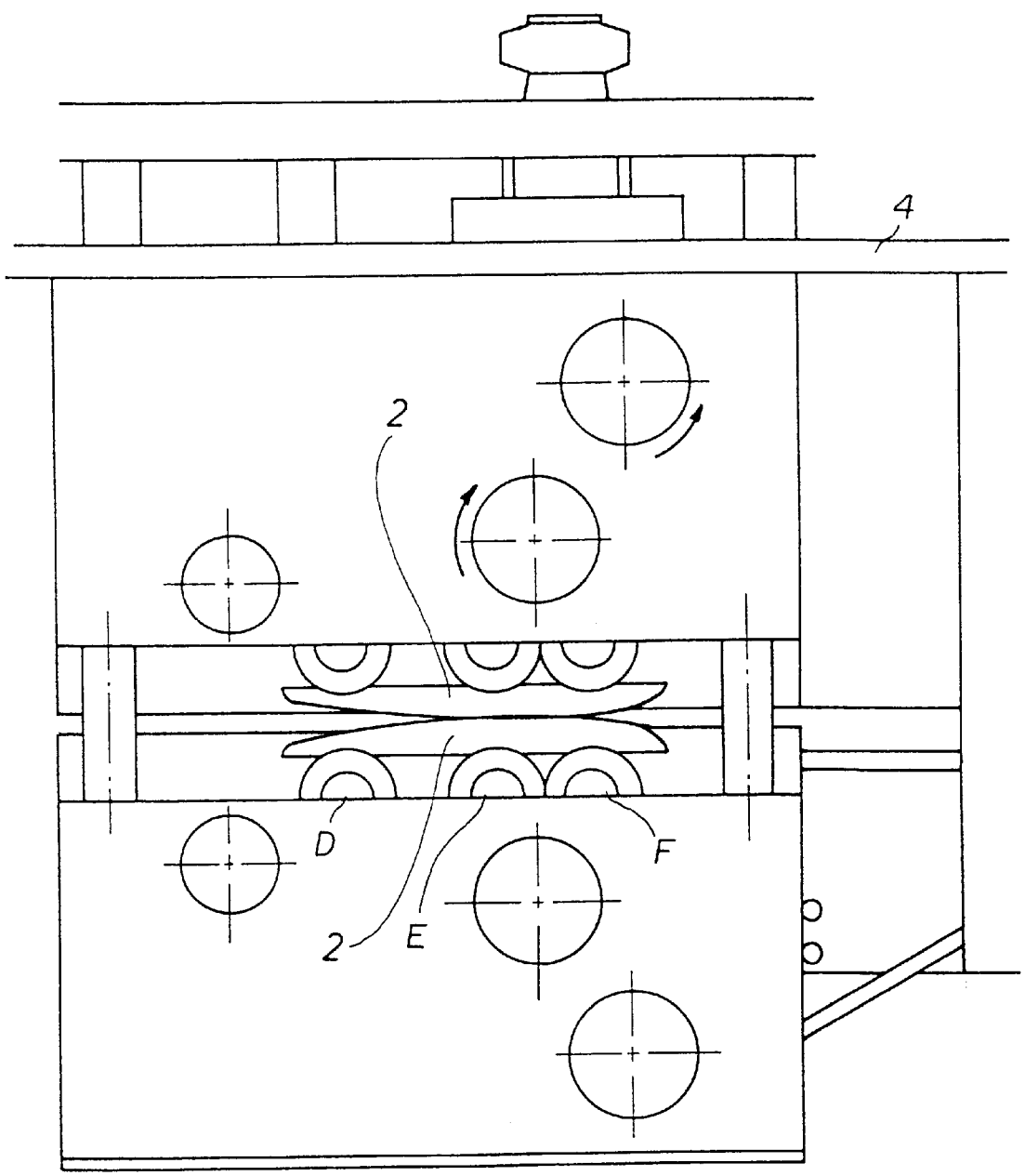
FIG. 5 is a side view of the entire tool machine.
Figure 6:
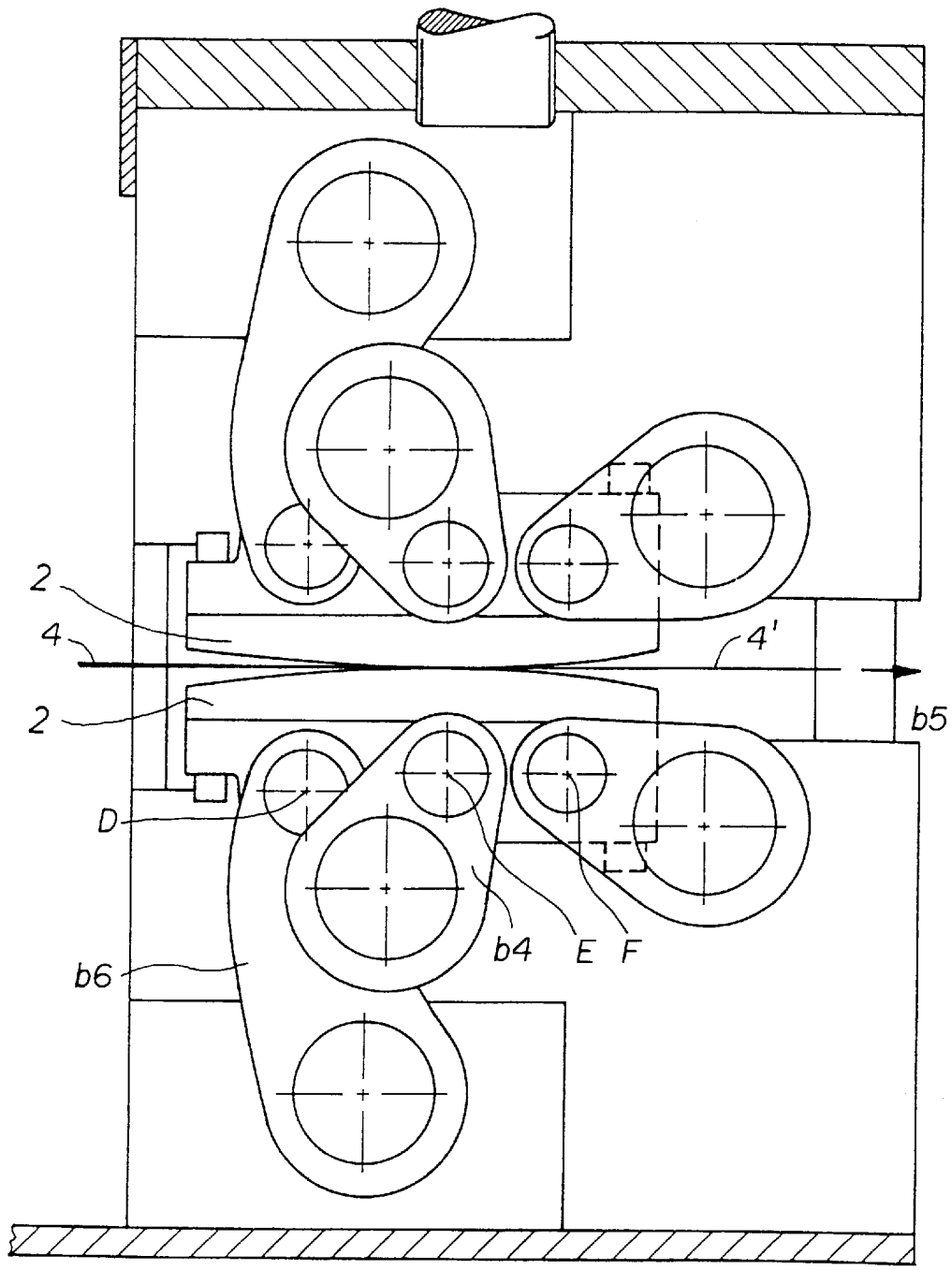
FIG. 6 is a sectional view of the tool machine of FIG. 5.

Modifiable parameters are:
α) The coordinates of the centers of rotation A, B, and C in a frame coordinate system, cf. FIG. 3,
β) the lengths of the eccentric arms $b_1$, $b_2$, and $b_3$,
γ) the phase displacements of the eccentric arms $\alpha_1$, $\alpha_2$, and $\alpha_3$,
δ) the points D, E, and F of the clamping jaws in the frame coordinate system.

It is determined that the securing points D, E, and F must have the same X-coordinate to the time t=0. The lengths of the hinged brackets $b_4$, $b_5$, and $b_6$ connected to the clamping jaws 2 in the points D, E, and F are then geometrically determined.

Ad 1a) When the clamping jaws 2 are to advance the wire 4, the points on the surfaces of the clamping jaws must present track curves in form of ellipses with substantially horizontal major axes, cf. FIG. 3. The appearance of the track curves reveals the horizontal and vertical movement Δx and Δy of the clamping jaws 2. Δx is set to 3 mm and Δy is set to 0.5 mm.

Ad 1b) It is desired that a strong force exerted on the clamping jaws 2 only necessitates a small torque on each driving shaft. The latter is obtained by dimensioning the tool machine in such a way that the most loaded driving shafts comprises the smallest eccentric arms and vice versa, and such that the angle φ1, φ2, and φ3 between an eccentric arm and a hinged bracket is close to 0° or 180° when the maximum force applies.

Ad 1c) In order to make room for shafts and possible pinions of sufficient dimensions, the most critical distances must be maximal without changing the kinematic properties. The critical distances are BE, CF, and the distance from the arm $b_5$ to the centre of rotation B.

A specific embodiment provided by means of the program CADME results in the following coordinates for the centre of rotation to the time t=0:
D=(45,25)
E=(80,25)
F=(140,25)
A=(0,0)
B=(95,−15)
c=(125,−75)

The lengths of the eccentric arms are
$b_1$=3.5 mm
$b_2$=0.5 mm
$b_3$=1.0 mm

The phase displacements of the eccentric arms are
$\alpha_1$=280°
$\alpha_2$=0°
$\alpha_3$=0°

A tool machine is thus provided according to the invention, which can reduce the thickness of a wire 4 by a semicontinuous pressing, which means that a superconducting wire can be formed continuously by a processing corresponding to a rolling with a roller diameter of approximately 3 m. Such a roller diameter renders it possible to compare the grain structure of the wire and the associated superconducting properties with the properties of pressed wires.

The most important properties of the tool machine are as follows:
it can simulate a rolling process by means of rollers of a diameter of approximately 3 m,
it can press with a force of up to 100 kN,
it can form wires of a thickness of up to 8 mm and a width of up to 15 mm, it can operate with broad clamping jaws in such a manner that wire widths of up to 35 mm can be processed, the distance between the clamping jaws can be adjusted with an accuracy of less than 5 μm, up to 120 pressings per minute can be performed. The wire is advanced approximately 4 mm per pressing, which means that up to ½ m of wire per minute can be produced in connection with 120 pressings per minute.

The tool machine is particularly rigid, and a good reproducibility is obtained.

The fact that the current-related properties can be improved by a uniaxial pressing can be utilized for producing particular structures, such as coil structures. FIGS. 7 to 11 illustrate examples thereof. A metal pipe is filled with raw powder and pulled into a long, thin, circular wire. Then the wire is formed into a coil-like structure which is subjected to mechanical deformation followed by heat-treatment.

Figure 7:
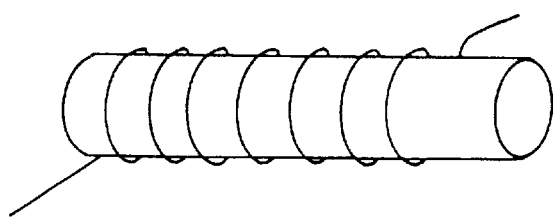
FIG. 7 illustrates a round wire wound on a cylindrical coil holder.
Figure 8:
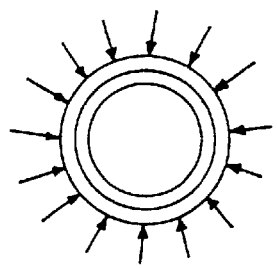
FIG. 8 illustrates the round wire of FIG. 7 subjected to planisostatic pressing.

FIG. 7 shows a round wire wound on a cylindrical coil holder along a helix into a cylindrical coil structure. The coil structure is then subjected to planisostatic pressing, cf. FIG. 8. The resulting magnetic field of the solenoid is perpendicular to the pressing direction.

Figure 9:
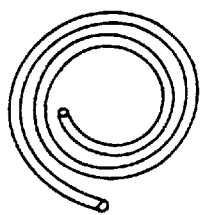
FIG. 9 illustrates a round wire wound into a flat coil structure.
Figure 10:
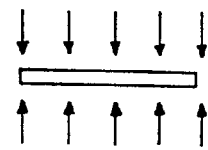
FIG. 10 illustrates the round wire of FIG. 9 subjected to uniaxial pressing.

FIG. 9 illustrates a round wire wound into a flat, almost helical coil structure. Then uniaxial pressing is exerted on the entire structure, cf. FIG. 10. Thereby the magnetic field of the coil extends parallel to the pressing direction.

Figure 11:
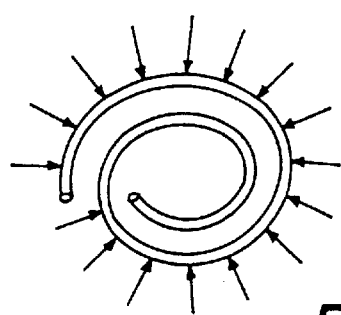
FIG. 11 illustrates a round wire wound into a flat coil structure and being subjected to planisostatic pressing.

FIG. 11 illustrates a thin wire wound into a flat coil structure, and which instead is subjected to a planisostatic pressing so as to deform the coil. The resulting magnetic field of the coil is perpendicular to the pressing direction.

What is claimed is:

1. A method for producing a superconductor, comprising;
   (a) providing a metal pipe having a longitudinal cavity filled with a mixture of metal oxides in polycrystalline powder form;
   (b) logitudinally pulling the filled pipe, for reducing the outer diameter thereof, to provide a pulled, filled pipe;
   (c) sintering the mixture of metal oxides in the pulled, filled pipe to provide a workpiece having a logitudinal axis; and
   (d) progressively flattening the workpiece in a succession of pressings between a pair of coordinately operated clamping jaws, the clamping jaws having respective curvilinear work surfaces extending along a curvilinear path in a lenghtwise direction, the clamping jaws respectively being mounted to hinged brackets connected by eccentric arms to rotatable shafts arranged for providing power transmission to the clamping jaws, said progressive flattening of the workpiece comprising:
      (i) positioning the workpiece so that the longitudinal axis thereof extends along the lengthwise direction of the curvilinear work surfaces and, while the workpiece is so positioned, moving the clamping jaws from clamping positions along paths of movement such that the curvilinear work surfaces flatten the workpiece as the curvilinear work surfaces move along a portion of the longitudinal axis, within a work area which is short relative to the length of the workpiece, substantially entirely by widening the workpiece without substantially lengthening the workpiece, each of the curvilinear workpiece surfaces having distinct opposite ends along the direction of the path of movement;
      (ii) advancing the workpiece about 4 mm between each pressing and returning the clamping jaws to the clamping positions along a direction opposite to said paths of movement; and
      (iii) repeating (i) and (ii) to thereby form a tape from the workpiece.

2. The method of claim 1, wherein said moving the clamping jaws comprises determining a moving pattern with a CADME and moving the clamping jaws along the moving pattern to flatten the workpiece substantially entirely by widening the workpiece with substantially lengthening the workpiece.

3. A method for producing a superconductor, comprising:
   (a) providing a metal pipe having a longitudinal cavity filled with a mixture of metal oxides in polycrystalline powder form;
   (b) longitudinally pulling the filled pipe, for reducing the outer diameter thereof, to provide a pulled, filled pipe;
   (c) sintering the mixture of metal oxides in the pulled, filled pipe to provide a workpiece; and
   (d) progressively flattening the workpiece in a succession of pressings between a pair of coordinately operated clamping jaws, the clamping jaws having respective curvilinear work surfaces extending along a curvilinear path along a lengthwise direction and defining a portion of an ellipse, the clamping jaws respectively being mounted to hinged brackets connected by eccentric arms to rotatable shafts arranged for providing power transmission to the clamping jaws, said progressive flattening of the workpiece comprising:
      (i) positioning the workpiece so that the longitudinal axis thereof extends along the lengthwise direction of the curvilinear work surfaces and, while the workpiece is so positioned moving the clamping jaws from clamping positions along paths of movement such that the curvilinear work surfaces flatten the workpiece as the curvilinear work surfaces move along a portion of the longitudinal axis, within a work area which is short relative to the length of the workpiece, substantially entirely by widening the workpiece without substantially lengthening the workpiece, each of the curvilinear workpiece surfaces having distinct opposite ends along the direction of the path of movement;
      (ii) advancing the workpiece about 4 mm between each pressing and returning the clamping jaws to the clamping positions along a direction opposite to the paths of movement; and
      (iii) repeating (i) and (ii) to thereby form a tape from the workpiece.

4. The method of claim 3, wherein said moving of the clamping jaws comprises determining a moving pattern with a CADME and moving the clamping jaws along the moving pattern to flatten the workpiece substantially entirely by widening the workpiece without substantially lengthening the workpiece.

* * * * *